(12) United States Patent
Joshi et al.

(10) Patent No.: US 10,888,036 B1
(45) Date of Patent: Jan. 5, 2021

(54) THERMAL MANAGEMENT ASSEMBLIES FOR ELECTRONIC ASSEMBLIES CIRCUMFERENTIALLY MOUNTED ON A MOTOR

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Shohei Suenaga, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 0 days.

(21) Appl. No.: 16/719,241

(22) Filed: Dec. 18, 2019

(51) Int. Cl.
*H05K 7/20* (2006.01)
*H02K 5/20* (2006.01)
(Continued)

(52) U.S. Cl.
CPC .......... *H05K 7/20927* (2013.01); *H02K 5/20* (2013.01); *H02K 11/0094* (2013.01);
(Continued)

(58) Field of Classification Search
CPC ............. H05K 7/20927; H05K 1/0203; H05K 1/0306; H05K 1/181; H05K 7/20909; H05K 7/20936; H05K 2201/09027; H05K 2201/10015; H05K 2201/10037; H05K 2201/10166; H05K 2201/10522; H05K 7/20; H05K 7/20218; H05K 7/2089; H05K 7/20845; H05K 7/205; H05K 7/20872;
(Continued)

(56) References Cited

U.S. PATENT DOCUMENTS

| | | | | |
|---|---|---|---|---|
| 4,818,906 A | * | 4/1989 | Kitamura | .................. H02K 9/19 310/58 |
| 4,980,588 A | * | 12/1990 | Ogawa | ...................... H02K 9/19 123/41.31 |

(Continued)

FOREIGN PATENT DOCUMENTS

| | | |
|---|---|---|
| JP | 6408857 B2 | 10/2018 |
| WO | 2007004429 A1 | 1/2007 |
| WO | WO-2013140704 A1 * 9/2013 | ......... H05K 7/20927 |

*Primary Examiner* — Anatoly Vortman
(74) *Attorney, Agent, or Firm* — Dinsmore & Shohl LLP

(57) ABSTRACT

An electronic assembly includes a PCB coupled to a mounting surface of a cooling jacket circumferentially mounted on a motor and a thermal management assembly (TMA) thermally connected to the PCB. One or more switching semiconductor devices are disposed on a first surface of the PCB proximate to the motor. The TMA includes the cooling jacket, at least one jacket manifold formed through the cooling jacket, a thermal compensation base layer thermally coupled to the cooling jacket and the one or more switching semiconductor devices, and a cooling manifold disposed through the PCB to form a fluid flow path. The at least one jacket manifold has a fluid inlet and a fluid outlet. Two or more electrically insulated posts, each having a cooling channel, are disposed between the at least one jacket manifold and the cooling manifold and form a fluid circuit between the fluid inlet and the fluid outlet.

20 Claims, 8 Drawing Sheets

(51) Int. Cl.
*H02K 11/33* (2016.01)
*H05K 1/03* (2006.01)
*H05K 1/02* (2006.01)
*H02K 11/00* (2016.01)
*H05K 1/18* (2006.01)

(52) U.S. Cl.
CPC ........... *H02K 11/33* (2016.01); *H05K 1/0203* (2013.01); *H05K 1/0306* (2013.01); *H05K 1/181* (2013.01); *H05K 7/20* (2013.01); *H05K 7/205* (2013.01); *H05K 7/2089* (2013.01); *H05K 7/20218* (2013.01); *H05K 7/20845* (2013.01); *H05K 7/20872* (2013.01); *H05K 7/20909* (2013.01); *H05K 7/20936* (2013.01); *H02K 2211/03* (2013.01); *H05K 2201/09027* (2013.01); *H05K 2201/10015* (2013.01); *H05K 2201/10037* (2013.01); *H05K 2201/10166* (2013.01); *H05K 2201/10522* (2013.01)

(58) Field of Classification Search
CPC ...... H02K 11/33; H02K 5/20; H02K 11/0094; H02K 2211/03
USPC .......................................... 361/699
See application file for complete search history.

(56) References Cited

U.S. PATENT DOCUMENTS

| | | | | |
|---|---|---|---|---|
| 5,058,660 A * | 10/1991 | Hedstrom | ................. | F01P 3/20 123/41.31 |
| 5,966,291 A * | 10/1999 | Baumel | ............. | H05K 7/20927 165/80.3 |
| 6,099,325 A * | 8/2000 | Parkhill | ............... | H01R 9/2466 361/707 |
| 6,198,183 B1 * | 3/2001 | Baeumel | ............... | F04D 25/068 310/52 |
| 6,680,552 B2 * | 1/2004 | Linden | .................... | H02K 5/20 123/41.31 |
| 7,207,187 B2 * | 4/2007 | Funahashi | ............... | F01C 21/10 62/113 |
| 7,210,304 B2 | 5/2007 | Nagashima et al. | | |
| 7,629,715 B1 * | 12/2009 | Sortore | .................... | H02K 9/19 310/52 |
| 8,148,859 B2 * | 4/2012 | Yoshida | ................... | H02K 5/20 310/54 |
| 8,556,011 B2 * | 10/2013 | Anwar | ............. | B60W 30/1843 180/65.275 |
| 8,649,159 B2 * | 2/2014 | Fujita | ..................... | H01L 24/40 361/622 |
| 8,659,896 B2 | 2/2014 | Dede et al. | | |
| 8,674,636 B2 * | 3/2014 | Matsuo | .................. | H01G 17/00 318/400.25 |
| 10,033,251 B2 * | 7/2018 | Monster | .................. | H02K 11/33 |
| 10,122,237 B2 * | 11/2018 | Hattori | .................. | H02K 5/225 |
| 10,361,608 B2 * | 7/2019 | Hasegawa | ............. | H02K 11/33 |
| 2003/0164650 A1 * | 9/2003 | Yockey | .................. | H02K 5/20 310/58 |
| 2006/0064998 A1 | 3/2006 | Funahashi et al. | | |
| 2008/0185924 A1 | 8/2008 | Masoudipour et al. | | |
| 2012/0153718 A1 * | 6/2012 | Rawlinson | ............ | B60L 15/007 307/10.1 |
| 2014/0265663 A1 * | 9/2014 | Chamberlin | ........... | H02K 15/14 310/59 |
| 2017/0264171 A1 | 9/2017 | Williams et al. | | |
| 2017/0346370 A1 * | 11/2017 | Sentis | ................ | H02K 15/0006 |
| 2018/0288907 A1 | 10/2018 | Richards | | |
| 2019/0202425 A1 | 7/2019 | Feigel et al. | | |
| 2019/0222018 A1 | 7/2019 | Reiter et al. | | |
| 2019/0252949 A1 | 8/2019 | Woody et al. | | |

* cited by examiner

US 10,888,036 B1

THERMAL MANAGEMENT ASSEMBLIES FOR ELECTRONIC ASSEMBLIES CIRCUMFERENTIALLY MOUNTED ON A MOTOR

TECHNICAL FIELD

The present specification generally relates to cooling structures for electronic assemblies and, more specifically, to thermal management assemblies for cooling electronic assemblies circumferentially mounted on a motor.

BACKGROUND

As electronic assemblies are designed to operate at increased power levels, they generate high heat flux due to the demands of electrical systems. This means that the printed circuit board (PCB) and the active and passive components disposed on the PCB in the electronic assembly should be able to withstand higher temperatures and thermally induced stresses. Conventional heat sinks may be unable to adequately remove sufficient heat to effectively lower the operating temperature of the electronic assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall electronic assemblies and make their thermal management challenging.

Further, due to technological advancement over the years, insulated gate bipolar transistors (IGBTs) have become the chosen power electronic device in electronic assemblies for a wide range of industrial power conversion applications, such as inverters used in electrified vehicles. The packaging technology for commercial IGBTs is based on wire-bonding technology used to connect dies and terminal leads. Stray inductance is a major concern in the design and layout of IGBT packages and power stages with both high switching speed and high power handling requirements. Moreover, since the power electronic device(s) and the gate drive device(s) used to control them are separate modules within the packaged power conversion assembly, the package design has an undesirably large size and suffers from parasitic inductance. Accordingly, compact electronic assemblies having both power electronic device(s) and gate drive device(s) integrated with thermal management assemblies for cooling the electronic assemblies may be desirable.

SUMMARY

The present specification relates to thermal management assemblies for cooling electronic assemblies circumferentially mounted on a motor. In one embodiment, a thermal management assembly for cooling an electronic assembly on a printed circuit board circumferentially disposed on a motor is disclosed. The thermal management assembly includes a cooling jacket, at least one jacket manifold formed through the cooling jacket and a thermal compensation base layer thermally coupled to the cooling jacket. The cooling jacket is configured to be mounted on a circumference of the motor and has a mounting surface tangential to the circumference of the motor. The at least one jacket manifold has a fluid inlet and a fluid outlet defining a fluid flow area therebetween. The thermal compensation base layer is configured to thermally connect the cooling jacket and one or more devices on the printed circuit board. The thermal management assembly further includes a cooling manifold configured to be disposed through the printed circuit board to form a fluid flow path through the printed circuit board. Two or more electrically insulated posts are disposed between the at least one jacket manifold and the cooling manifold. An individual electrically insulated post has a cooling channel therethrough. The cooling channel in at least a first electrically insulated post fluidly connects the fluid inlet to the cooling manifold to form an inward fluid path and the cooling channel in at least a second electrically insulated post fluidly connects the cooling manifold to the fluid outlet to form an outward fluid path.

In another embodiment, an electronic assembly is disclosed. The electronic assembly includes a printed circuit board having a first surface and a second surface opposite to the first surface. The printed circuit board is circumferentially disposed on a motor. One or more switching semiconductor devices are disposed on the first surface. The electronic assembly further includes a thermal management assembly thermally connected to the printed circuit board. The thermal management assembly includes a cooling jacket mounted on a circumference of a motor, at least one jacket manifold formed through the cooling jacket and a thermal compensation base layer thermally coupled to the cooling jacket and the one or more switching semiconductor devices. The cooling jacket has a mounting surface tangential to the circumference of the motor and the mounting surface is coupled to the first surface of the printed circuit board. The at least one jacket manifold has a fluid inlet and a fluid outlet defining a fluid flow area therebetween. The thermal management assembly further includes a cooling manifold disposed through the printed circuit board to form a fluid flow path through the printed circuit board. Two or more electrically insulated posts are disposed between the at least one jacket manifold and the cooling manifold. An individual electrically insulated post has a cooling channel therethrough. The cooling channel in at least a first electrically insulated post fluidly connects the fluid inlet to the cooling manifold to form an inward fluid path and the cooling channel in at least a second electrically insulated post fluidly connects the cooling manifold to the fluid outlet to form an outward fluid path.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to thermal management assemblies for cooling electronic assemblies circumferentially mounted on a motor. The thermal management assemblies are thermally connected to a printed circuit board (PCB) on which the electronic assemblies comprising active and passive components are disposed. As used herein, the term "active component" is defined as a component that can electrically control current by means of an electrical signal and introduce energy when placed in an electrical/electronic circuit, while the term "passive component" is defined as a component that cannot electrically control current and hence does not introduce energy when placed in an electrical/electronic circuit.

The thermal management assemblies described herein are configured to remove heat generated by the switching semiconductor devices during the operation of an integrated electronic assembly circumferentially mounted on a motor. The integrated electronic assembly includes both the power electronic device(s) and the gate drive device(s) used to control them in a single package. The thermal management assemblies achieve two-fold cooling of the integrated electronic assembly through a thermal compensation base layer and a fluid circuit connecting the PCB and a cooling jacket mounted on a circumference of the motor. The fluid circuit is formed between a fluid inlet and a fluid outlet connecting, through channels, a jacket manifold within the cooling jacket and a cooling manifold disposed within the PCB. Various other aspects of the disclosure and variations thereof are illustrated or implied through the descriptions of the embodiments below.

Figure 1A:
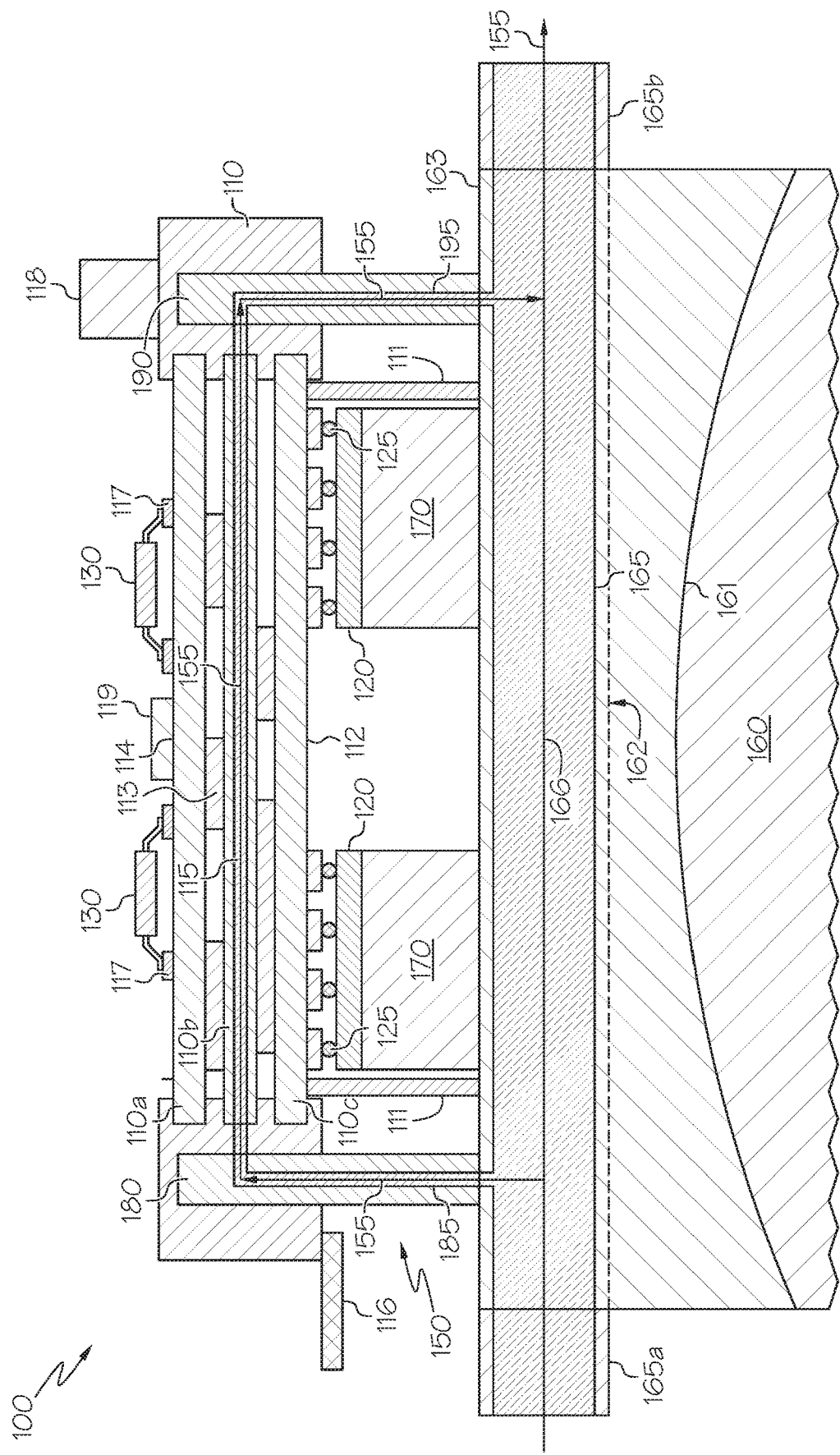
FIG. 1A depicts a lengthwise cross-sectional view of an electronic assembly disposed on a cooling jacket circumferentially mounted on a motor and integrated with a thermal management assembly having a thermal compensation base layer that includes a thermally conductive mount made of a metal or an alloy, according to one or more embodiments shown and described herein.
Figure 1B:
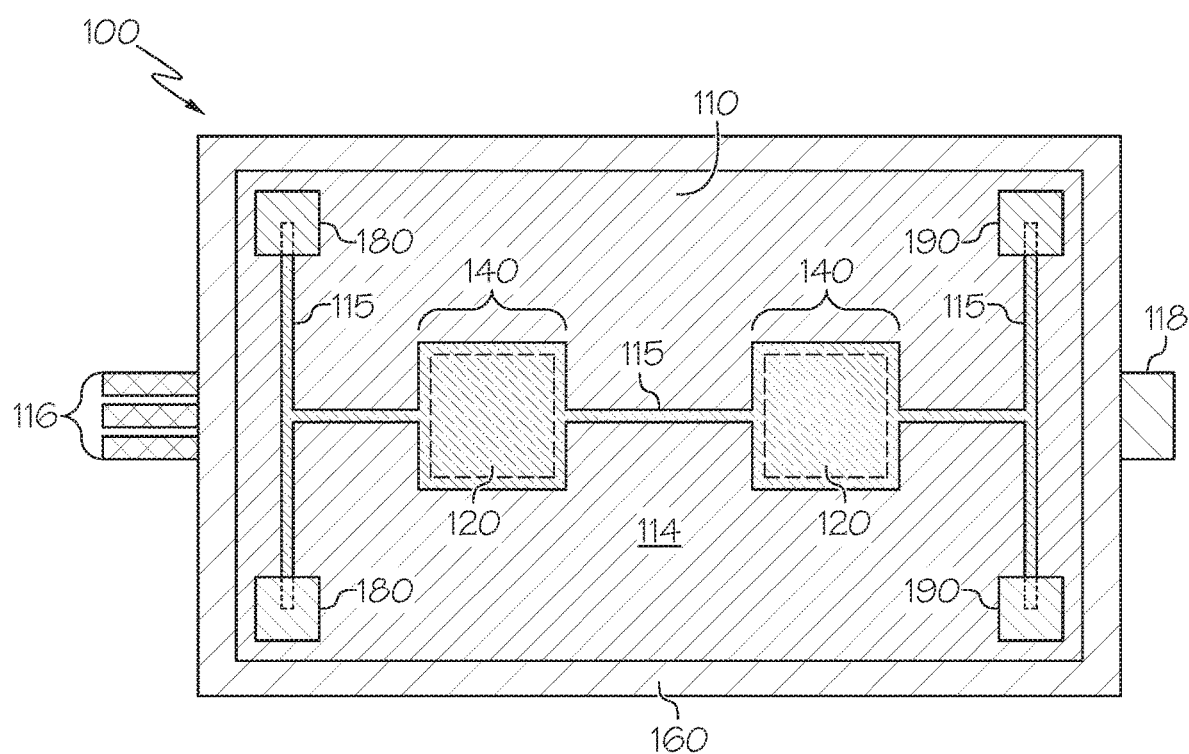
FIG. 1B depicts a top cross-sectional view of the electronic assembly of FIG. 1A, according to one or more embodiments shown and described herein.
Figure 1C:
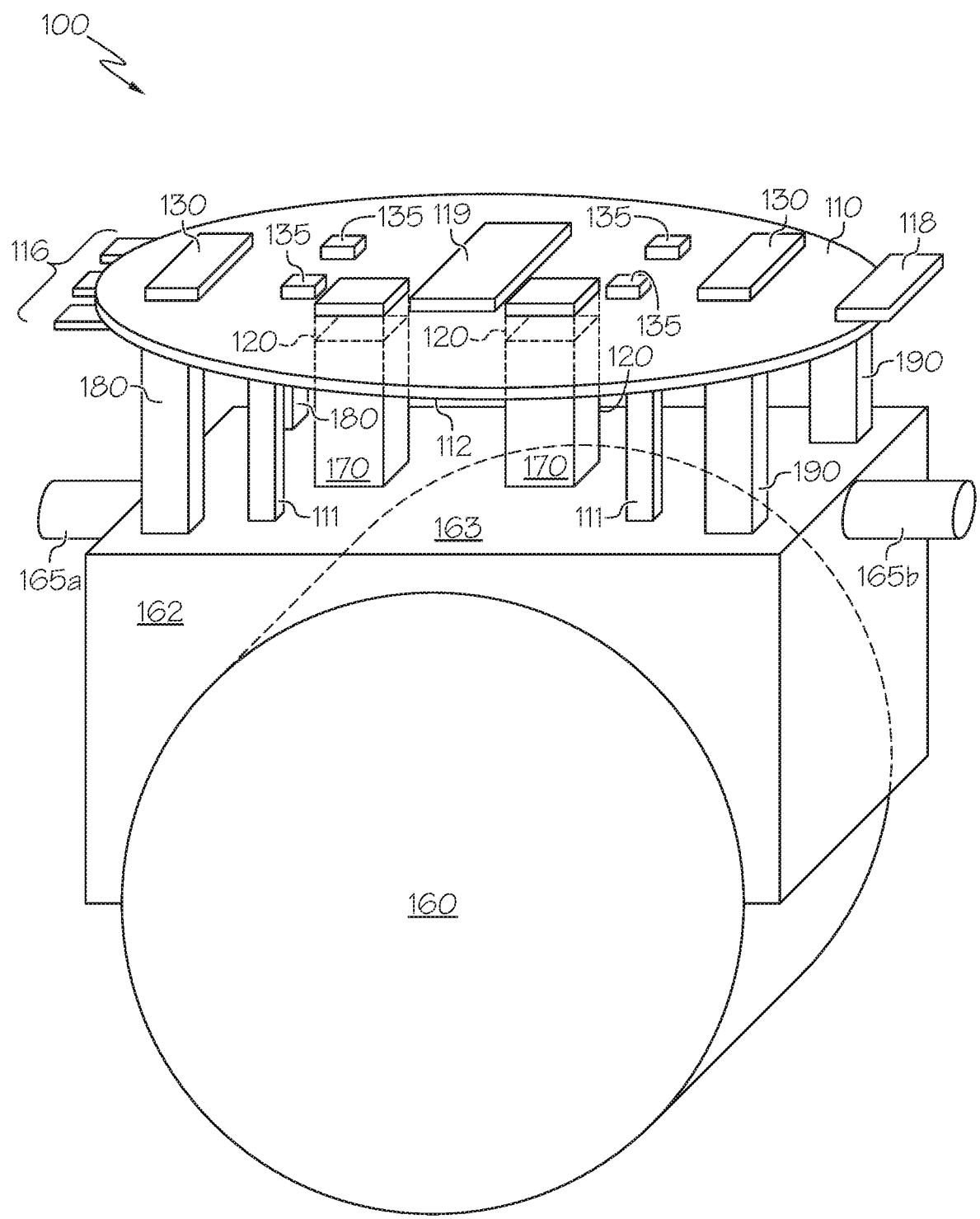
FIG. 1C depicts a perspective view of the electronic assembly of FIG. 1A, according to one or more embodiments shown and described herein.

FIG. 1A depicts a lengthwise cross-sectional view of an example electronic assembly 100 circumferentially mounted on a motor 160 and integrated with an example thermal management assembly 150, which is thermally connected to a PCB 110 of the example electronic assembly 100. The thermal management assembly 150 includes, among other components, a cooling jacket 162 mounted on a circumference 161 of the motor 160, as shown in FIGS. 1A and 1C. The cooling jacket has a mounting surface 163 that is tangential to the circumference 161 of the motor 160. The cooling jacket 162 is formed from any suitable material such as, but not limited to, copper, aluminum, or nickel. FIGS. 1B and 1C depict a top cross-sectional view and a perspective view of the example electronic assembly 100 shown in FIG. 1A.

The PCB 110 is disposed on the mounting surface 163 of the cooling jacket 162 and configured as a substrate on which electronic devices can be disposed. The PCB 110 is multi-layered and in a non-limiting embodiment, may be shaped as a cylindrical disk, as shown in FIGS. 1B-1C.

The example PCB 110 includes three core layers 110a, 110b, and 110c having one or more prepreg layers 113 in between, as shown in FIG. 1A. The PCB has a bottom surface 112 coupled to the mounting surface 163 of the cooling jacket 162 and a top surface 114. In some embodiments, the PCB 110 may be composed of a flame-retardant composite material formed from glass fiber reinforced epoxy resin such as, but not limited to, FR-4. In other embodiments, the PCB 110 may be composed of a ceramic material capable of withstanding temperatures in excess of 250° C. such as, but not limited to, an Low Temperature Co-fired Ceramic (LTCC) material or aluminum oxide. The core layer 110b has a cooling manifold 115 disposed therethrough. The cooling manifold 115 is electrically isolated and configured to provide a targeted fluid flow path for absorbing heat from the electronic devices.

The example PCB 110 may have copper patterns on which electronic devices can be bonded. One or more phase wiring connections 111 are positioned between the PCB 110 and the cooling jacket 162 for electrically coupling the electronic devices on the PCB 110 to the motor 160 for phase connection. In the embodiment shown in FIG. 1A, the phase wiring connections 111 are electrically conductive posts. In other embodiments, the phase wiring connection between the electronic devices on the PCB 110 and the motor 160 may be provided through phase wiring cables 211 (shown in FIG. 2A) extending externally between the top surface 114 of the PCB 110 and the motor 160. A capacitor 119 may be centrally disposed on the top surface 114 of the PCB 110 and configured to be electrically connected to a battery (not shown).

One or more switching devices 120 are mounted on the bottom surface 112 of the PCB 110 via a well-known surface-mount packaging technology. The switching devices 120 are one or more active components. In some embodiment shown in FIG. 1A, the switching devices 120 are mounted on the bottom surface 112 using a flip chip ball grid array arrangement comprising a plurality of solder balls 125 made from a high temperature silver or an alloy made of high temperature silver. In other embodiments, the switching devices 120 can be mounted by other means. The switching devices 120 may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the switching devices 120 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the switching devices 120 operate at high current and under high temperatures, for example in excess of 250° C. and generate a large amount of heat that must be removed for the continued operation of the electronic assembly 100. A power terminal 116 having positive and negative output is coupled to the bottom surface 112 of the PCB 110.

One or more gate drive devices 130 are bonded to the top surface 114 of the PCB 110 via bonding layers 117. The bonding layer 117 may be a solder layer or a transient liquid phase (TLP) bonding layer. The gate drive devices 130 are one or more active components. The gate drive devices 130 are configured to control the operation of the switching devices 120 and may be coupled to one or more passive components 135 such as, but not limited to, capacitor(s), resistor(s), transformer(s) and inductor(s). A signal connector 118 configured to connect with a signal controller (not shown) is disposed on the top surface 114 of the PCB 110.

The switching devices 120 are thermally coupled (for example, via mechanical connection) to a thermal compensation base layer 170, which is thermally coupled to the cooling jacket 162 mounted on a circumference of the motor 160. Thus, the thermal compensation base layer 170 thermally connects the switching devices 120 to the cooling jacket 162. In some embodiments, such as that shown in FIG. 1A, the thermal compensation base layer 170 is a thermally conductive mount made of copper, aluminum, nickel, and/or alloys thereof.

In the example embodiment shown in FIG. 1A, the cooling jacket 162 has a jacket manifold 165 formed through the cooling jacket 162. In other embodiments, the cooling jacket 162 may have more than one jacket manifold 165. In the embodiment shown in FIG. 1A, a cooling fluid flows through the jacket manifold 165 in a linear direction 166 tangential to the circumference 161 of the motor 160 between a fluid inlet 165*a* and a fluid outlet 165*b*, defining a fluid flow area therebetween. The cooling fluid is configured to absorb and transfer heat generated from the operation of the electronic assembly 100 as well as the motor 160. The cooling fluid may be air, an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase.

One or more electrically insulated posts 180 are disposed between the cooling jacket 162 and the PCB 110 proximate to the fluid inlet 165*a*. The electrically insulated posts 180 extend through the core layers 110*a*, 110*b*, and 110*c* of the PCB 110. The electrically insulated posts 180 have respective cooling channels 185 fabricated therethrough. The cooling channel 185 structurally connects the fluid inlet 165*a* of the jacket manifold 165 with the cooling manifold 115, thus forming an inward fluid path. In the embodiment shown in FIGS. 1A-1C, two electrically insulated posts 180 form two cooling channels 185 that connect the jacket manifold 165 to the cooling manifold 115. However, in other embodiments, there could be more or less than two electrically insulated posts 180. As non-limiting examples, the electrically insulated posts 180 may be made of poly-silicon or a ceramic material.

Similarly, one or more electrically insulated posts 190 are disposed between the cooling jacket 162 and the PCB 110 proximate to the fluid outlet 165*b*. The electrically insulated posts 190 extend through the core layers 110*a*, 110*b*, and 110*c* of the PCB 110. The electrically insulated posts 190 have respective cooling channels 195 fabricated therethrough. The cooling channel 195 structurally connects the cooling manifold 115 with the fluid outlet 165*b* of the jacket manifold 165, thus forming an outward fluid path. In the embodiment shown in FIGS. 1A-1C, two electrically insulated posts 190 form two cooling channels 195 that connect the cooling manifold 115 to the jacket manifold 165. However, in other embodiments, there could be more or less than two electrically insulated posts 190. As non-limiting examples, the electrically insulated posts 190 may be made of poly-silicon or a ceramic material.

The cooling fluid entering the jacket manifold 165 at the fluid inlet 165*a* is directed to flow, for example by a pump (not shown), through the inward fluid path within the cooling channels 185 and into the cooling manifold 115. The cooling manifold 115 has one or more heat transfer chambers 140 positioned strategically above and configured to absorb maximum heat flux generated by the one or more switching devices 120. As shown in FIG. 1B, the example cooling manifold 115 has two heat transfer chambers 140 positioned above the two switching devices 120 respectively. Upon absorbing the heat generated by the switching devices 120, the cooling fluid flows down through the outward fluid path within the cooling channels 195 and back into the jacket manifold 165, before it finally exits through the fluid outlet 165*b*. The flow of the cooling fluid through the inward fluid path in the cooling channels 185, through the cooling manifold 115 and the outward fluid path in the cooling channels 195 comprise a fluid circuit 155 between the jacket manifold 165 and the cooling manifold 115.

The cooling jacket 162 disposed circumferentially on the motor 160, the jacket manifold 165, the thermal compensation base layer 170, the cooling manifold 115, and the cooling channels 185, 195 within the electrically insulated posts 180, 190 forming the fluid circuit 155 comprise the thermal management assembly 150. Heat is removed through the thermal compensation base layer 170 as well as the cooling fluid flowing through the jacket manifold 165, the fluid circuit 155, and the cooling manifold 115, as described above. The thermal management assembly 150 is thermally connected to the PCB 110 and thus configured to remove heat from the electronic assembly 100 at high operating temperatures, for example in excess of 250° C.

Figure 2A:
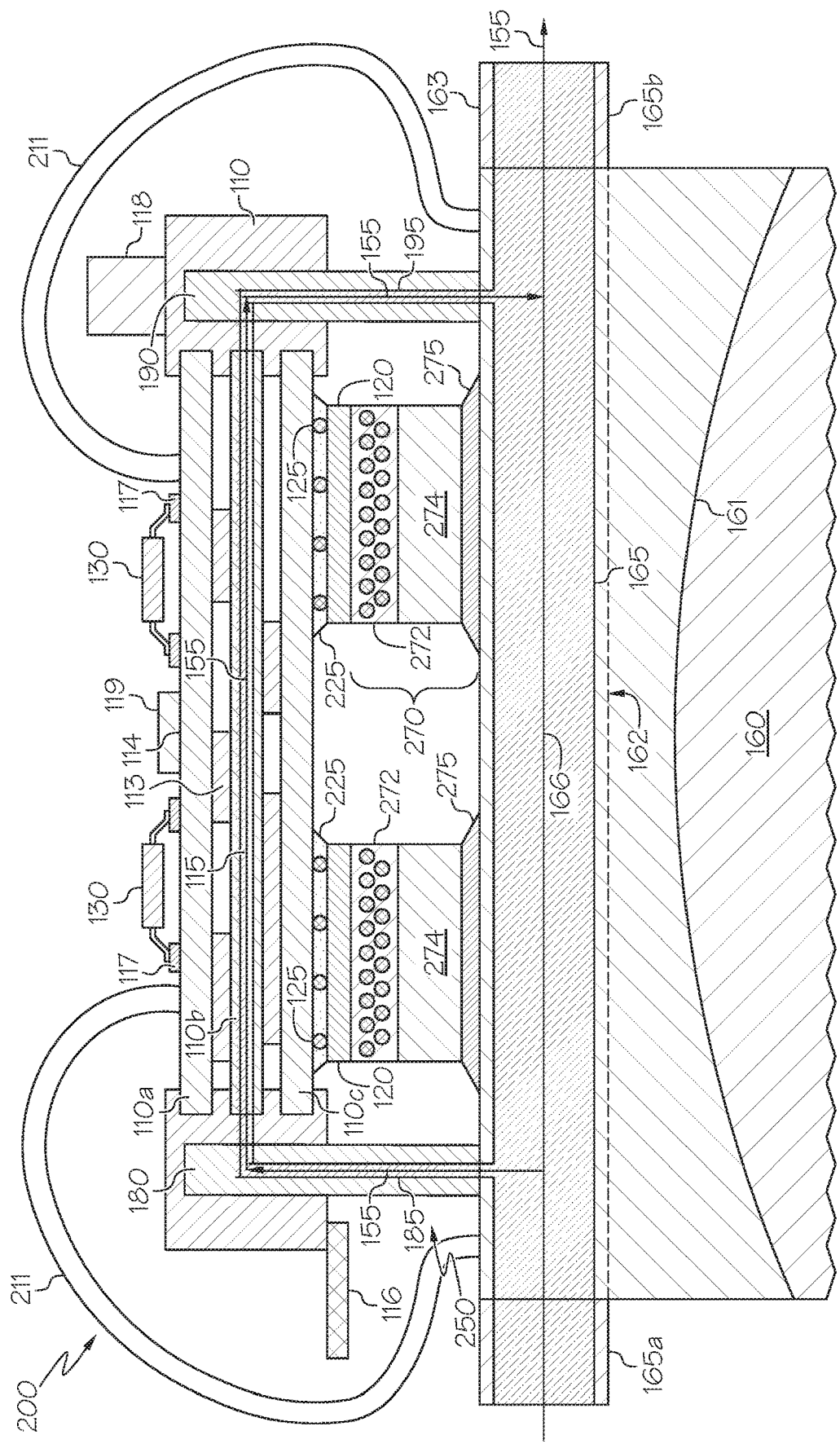
FIG. 2A depicts a lengthwise cross-sectional view of an electronic assembly disposed on a cooling jacket circumferentially mounted on a motor and integrated with a thermal management assembly having a thermal compensation base layer that includes a metal inverse opal (MIO) structure, according to one or more embodiments shown and described herein.
Figure 2B:
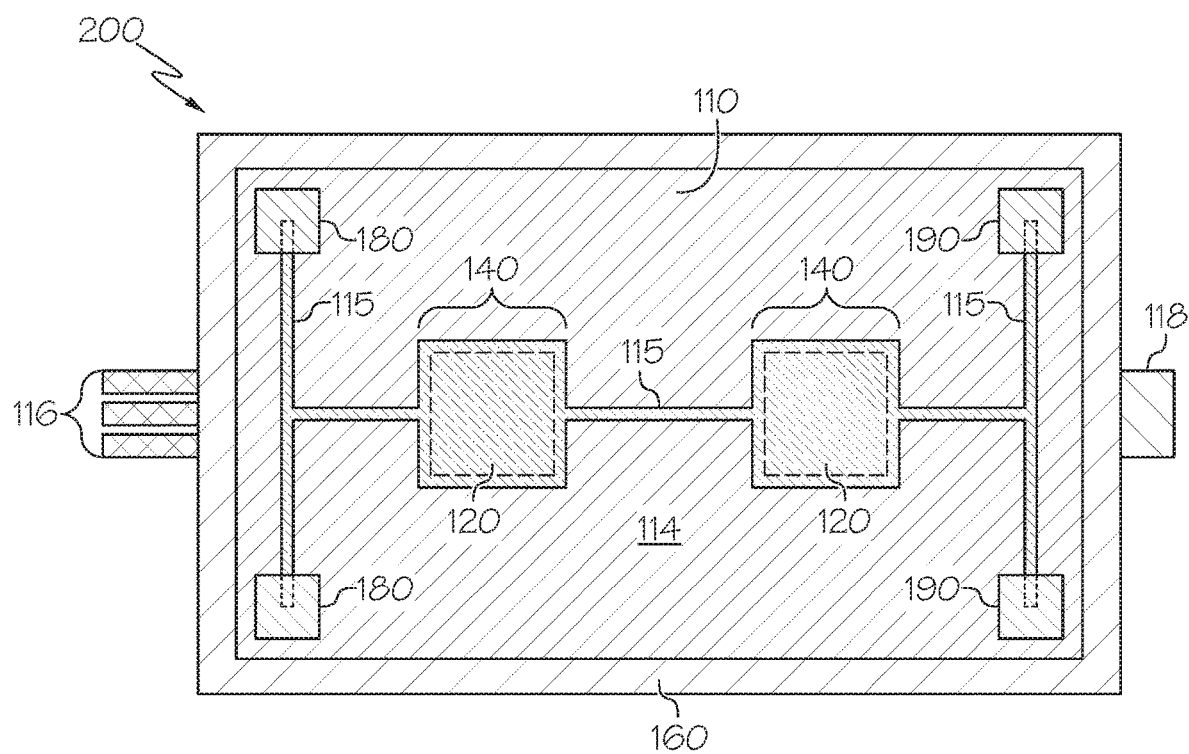
FIG. 2B depicts a top cross-sectional view of the electronic assembly of FIG. 2A, according to one or more embodiments shown and described herein.
Figure 2C:
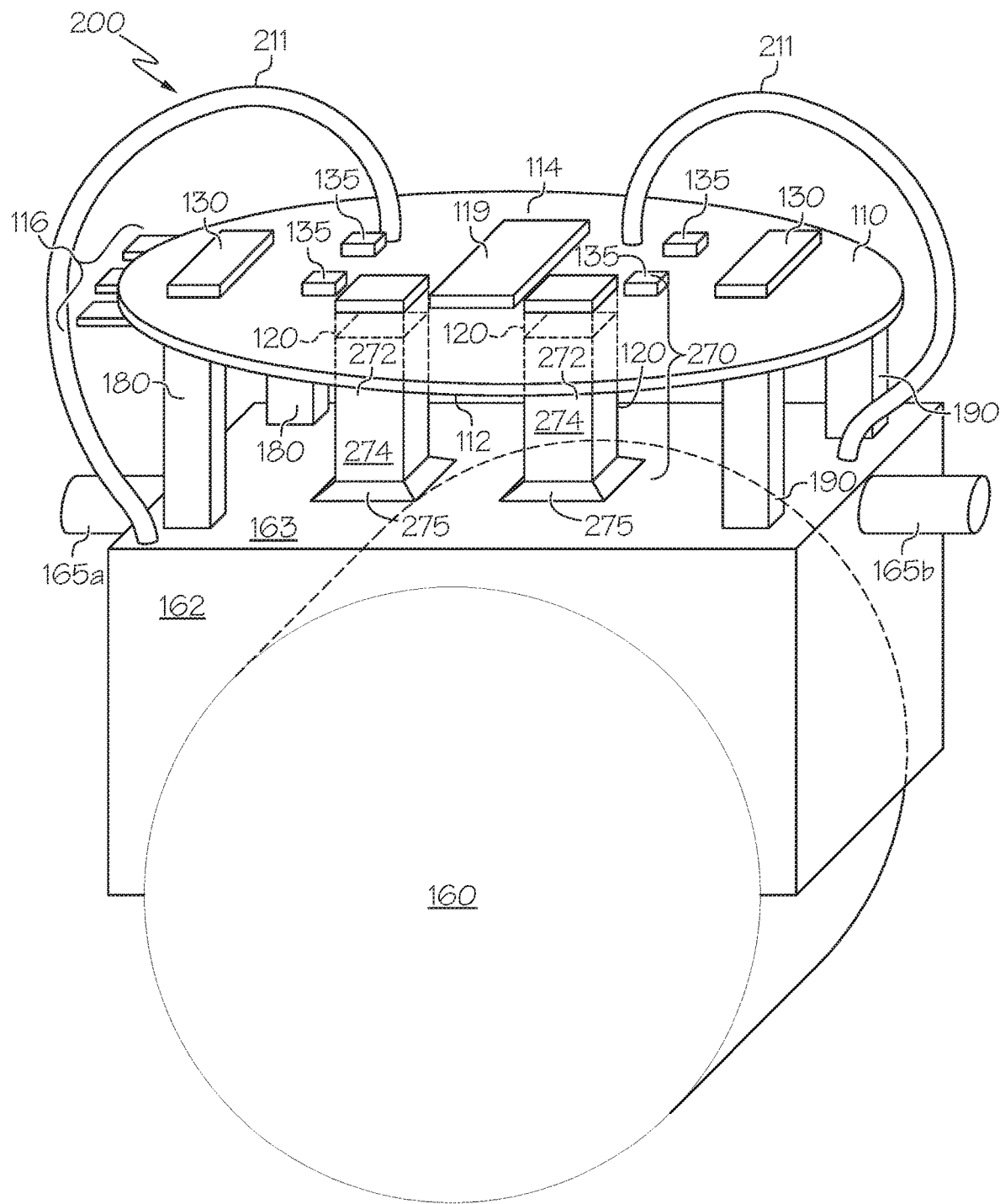
FIG. 2C depicts a perspective view of the electronic assembly of FIG. 2A, according to one or more embodiments shown and described herein.

FIG. 2A depicts a lengthwise cross-sectional view of another example electronic assembly 200 integrated with an example thermal management assembly 250 having a thermal compensation base layer 270 that includes a metal inverse opal (MIO) structure 272. FIGS. 2B and 2C depict atop cross-sectional view and a perspective view of the example electronic assembly 200 shown in FIG. 2A.

The example electronic assembly 200 includes the multilayered PCB 110 having the cooling manifold 115 disposed through the core layer 110*b*, as described above. The cooling manifold 115 is electrically isolated and configured to provide a targeted fluid flow path for absorbing heat from the electronic devices disposed on the PCB 110.

The example PCB 110 may have copper patterns on which electronic devices can be bonded. One or more phase wiring cables 211 are positioned externally between the top surface 114 of the PCB 110 and the motor 160 for electrically coupling the electronic devices on the PCB 110 to the motor 160 for phase connection. A capacitor 119 may be centrally disposed on the top surface 114 of the PCB 110 and configured to be electrically connected to a battery (not shown).

One or more switching devices 120 and the power terminal 116 having positive and negative output are mounted on the bottom surface 112 of the PCB 110. In some embodiments, an underfill material 225 may be provided around the plurality of solder balls 125 for enhanced stability of the mounted switching devices 120. One or more gate drive devices 130 are bonded to the top surface 114 of the PCB 110. The signal connector 118 is disposed on the top surface 114 of the PCB 110.

The switching devices 120 are thermally coupled (for example, via mechanical connection) to the thermal compensation base layer 270, which is thermally coupled to the cooling jacket 162 circumferentially mounted on the motor 160. Thus, the thermal compensation base layer 270 thermally connects the switching devices 120 to the cooling jacket 162. In some embodiments, such as that shown in FIG. 2A, the thermal compensation base layer 270 includes the MIO structure 272, a cap layer 274 overgrown on the MIO structure 272, and an electrically insulating layer 275 disposed between the cap layer 274 and the cooling jacket 162. In some embodiments, the electrically insulating layer 275 may be a metal oxide such as, but not limited to, copper oxide.

The MIO structure 272 includes any inverse opal structure, such as, for example, a copper inverse opal (CIO) structure, a nickel inverse opal (NIO) structure, or other inverse opal structure made from, without limitation, aluminum, silver, zinc, magnesium, or alloys thereof. The MIO structure 272 is an integrated metal porous structure that provides a combination of large surface-to-volume ratio, high conductivity, and mechanical compliance and thus can improve heat dissipation from the electronic assembly 200. The MIO structure 272 can also provide thermal stress relief due to mismatch in the coefficient of thermal expansion (CTE) with the components of the electronic assembly 200. The cap layer 274 is formed by further deposition of the corresponding metal of the MIO structure 272, i.e. copper, nickel, etc. over the inverse opal structure of MIO structure 272.

In the example embodiment shown in FIG. 2A, the cooling jacket 162 circumferentially mounted on the motor 160, the jacket manifold 165, the thermal compensation base layer 270, the cooling manifold 115, and the cooling channels 185, 195 within the electrically insulated posts 180, 190 forming the fluid circuit 155 comprise the thermal management assembly 250, which operates substantially similar to the thermal management assembly 150 depicted by FIGS. 1A-IC. Heat is removed through the thermal compensation base layer 270 as well as a cooling fluid flowing through the jacket manifold 165, the fluid circuit 155, and the cooling manifold 115, as described above. The thermal management assembly 250 is thermally connected to the PCB 110 and thus configured to remove heat from the electronic assembly 200 at high operating temperatures, for example in excess of 250° C.

Figure 3A:
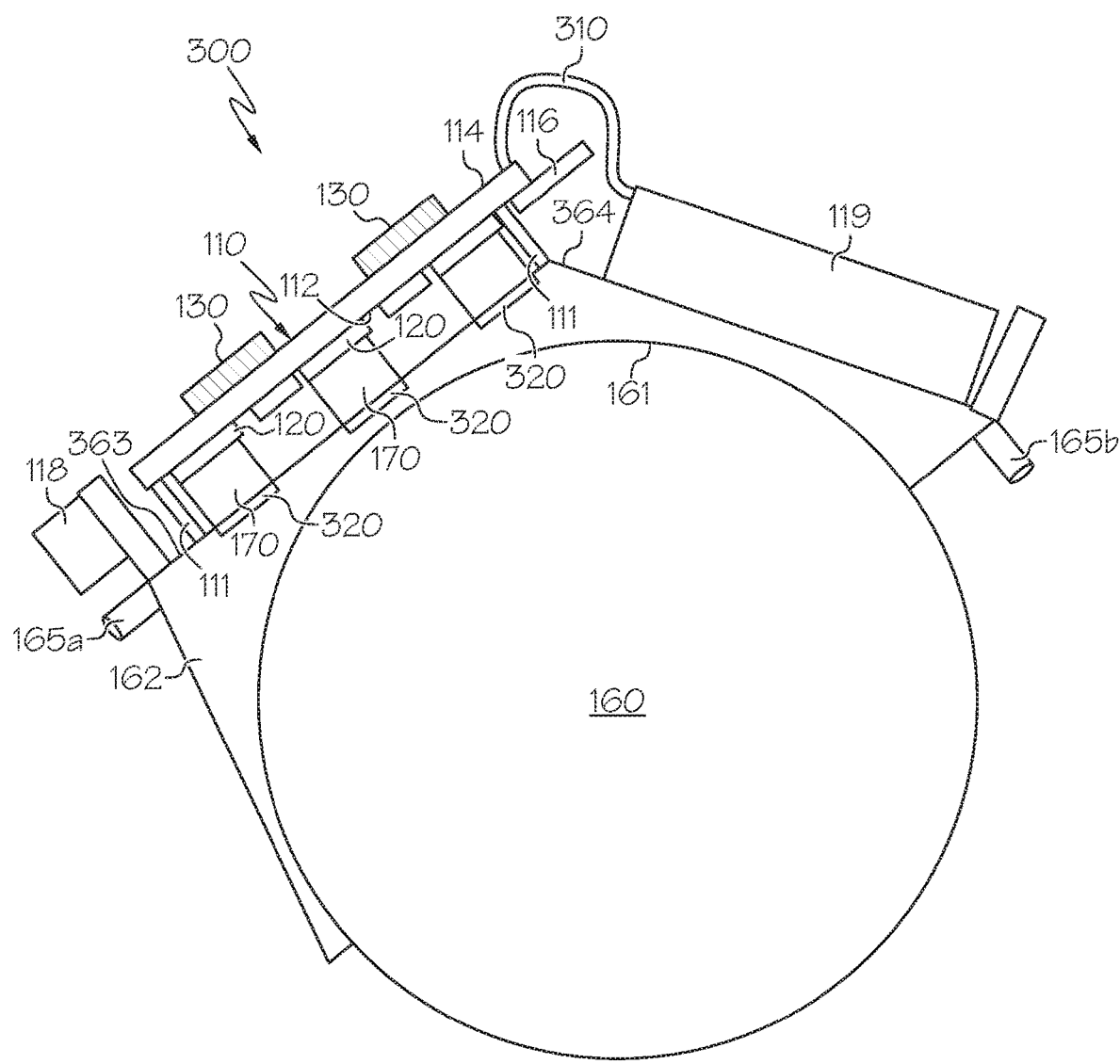
FIG. 3A depicts a lengthwise side view of an electronic assembly disposed on a cooling jacket circumferentially mounted on a motor, where the electronic assembly is integrated with a thermal management assembly having a thermal compensation base layer and the cooling jacket has a separate mounting surface on which a capacitor coupled to the electronic assembly, is disposed, according to one or more embodiments shown and described herein.
Figure 3B:
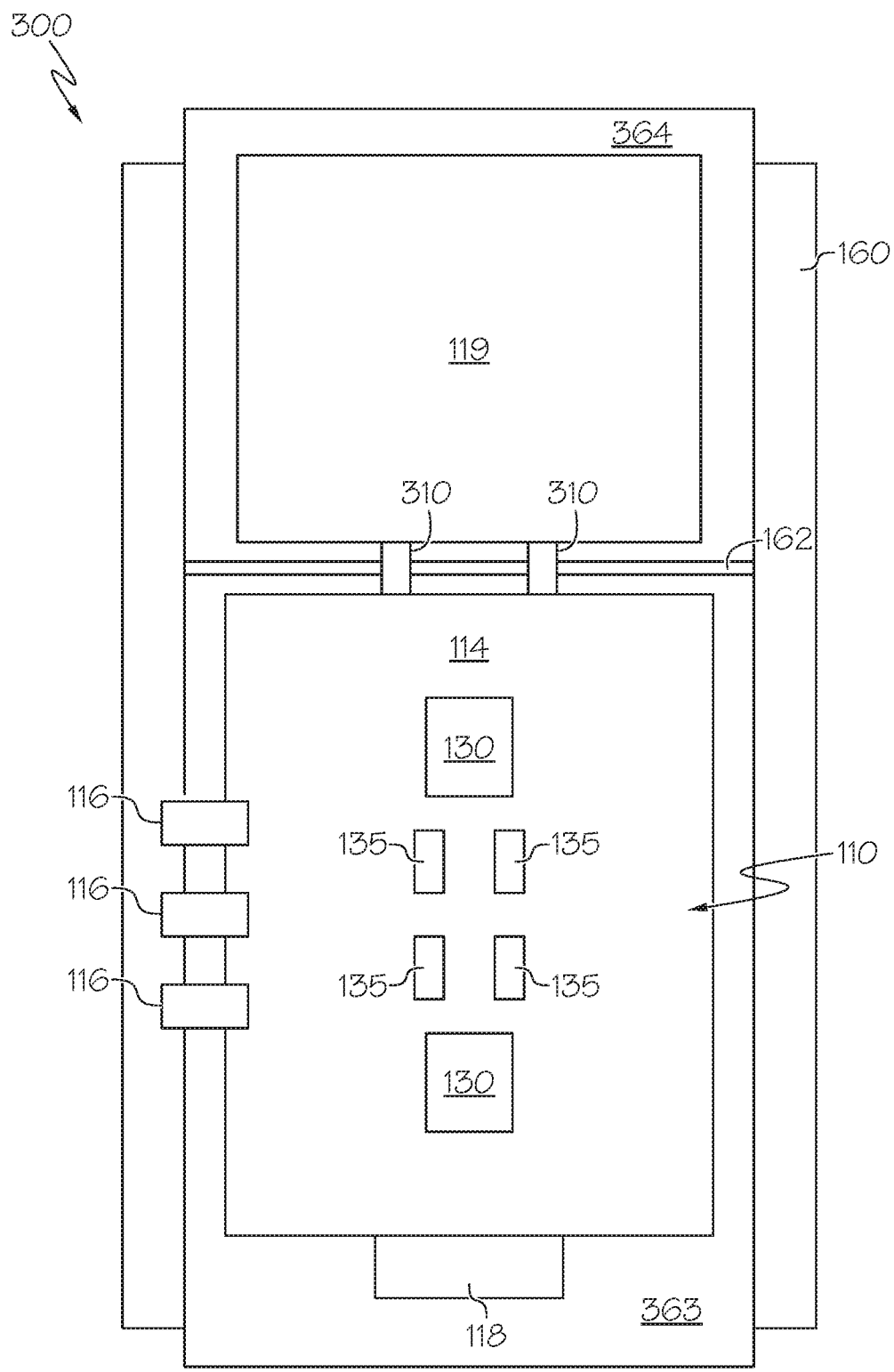
FIG. 3B depicts atop view of the electronic assembly of FIG. 3A, according to one or more embodiments shown and described herein.

FIGS. 3A-3B depict a lengthwise side view and top view respectively of an electronic assembly 300 disposed on the cooling jacket 162 circumferentially mounted on the motor 160. The cooling jacket 162 has a first mounting surface 363 and a second mounting surface 364, both of which are tangential to the circumference 161 of the motor 160. The multi-layered PCB 110 is coupled to the first mounting surface 363. The PCB 110 has one or more switching semiconductor devices 120 disposed on the bottom surface 112 and one or more gate drive devices 130 disposed on the top surface 114. The capacitor 119 is disposed on the second mounting surface 364. The capacitor 119 is electrically coupled to the PCB 110 through one or more wire(s) 310 as well as to a battery (not shown).

One or more phase wiring connections 111, in the form of electrically conductive posts are positioned between the PCB 110 and the cooling jacket 162 for electrically coupling the electronic devices on the PCB 110 to the motor 160 for phase connection. The power terminal 116 having positive and negative output are mounted on the bottom surface 112 of the PCB 110. The signal connector 118 is disposed on mounting surface 363 of the cooling jacket 162 and coupled to the PCB 110.

The mounting surface 363 of the cooling jacket 162 further includes one or more slots 320 to accommodate the thermal compensation base layer 170 coupled to each of the one or more switching semiconductor devices 120 on the PCB 110. A grease layer may be applied between the thermal compensation base layer 170 and the surface of the slots 320 during installation. The grease layer may be a commonly known thermal interface material (TIM) used for enhanced thermal connection.

The cooling jacket 162 has a jacket manifold 165 that includes a fluid inlet 165a and a fluid outlet 165b. The cooling jacket 162 circumferentially mounted on the motor 160, the jacket manifold 165, the thermal compensation base layer 170, and a fluid circuit (not shown but substantially similar to the fluid circuit 155) comprise a thermal management assembly, which operates substantially similar to the thermal management assembly 150 depicted by FIGS. 1A-1C.

The thermal management assemblies described herein can be advantageously used as a thermal management solution for electronic assemblies circumferentially mounted on a motor and having high heat flux applications. In vehicular applications, especially for the power electronic assemblies used as inverters in electric vehicles, this enables the electronic assemblies to be maintained within a suitable operating temperature range. The structures of the electronic assemblies described herein significantly reduces packaging size of electronic assemblies by combining the both the power electronic device(s) and the gate drive device(s) into a single package. Power electronic device(s) can be integrated with the gate drive device(s) into a single compact package without interfering with the signal interaction between the power electronic device(s) and the gate drive device(s), while cooling the electronic assemblies at the same time. Finally, since the gate drive device(s) are positioned closer to the power electronic device(s), parasitic inductance is reduced.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermal management assembly for cooling an electronic assembly on a printed circuit board circumferentially disposed on a motor, the thermal management assembly comprising:

a cooling jacket configured to be mounted on a circumference of the motor, the cooling jacket having a mounting surface tangential to the circumference of the motor;

at least one jacket manifold formed through the cooling jacket, the at least one jacket manifold having a fluid inlet and a fluid outlet and defining a fluid flow area therebetween;

a thermal compensation base layer thermally coupled to the cooling jacket and configured to thermally connect the cooling jacket and one or more devices on the printed circuit board;

a cooling manifold configured to be disposed through the printed circuit board and form a fluid flow path through the printed circuit board; and two or more electrically insulated posts disposed between the at least one jacket manifold and the cooling manifold and having a cooling channel through individual electrically insulated posts, wherein the cooling channel in at least one electrically insulated post fluidly connects the fluid inlet to the cooling manifold to form an inward fluid path and the cooling channel in at least one electrically insulated post fluidly connects the cooling manifold to the fluid outlet to form an outward fluid path.

2. The thermal management assembly of claim 1, wherein the one or more electrically insulated posts comprise poly-silicon or a ceramic material.

3. The thermal management assembly of claim 1, wherein the cooling jacket is formed from one or more of the following: copper, aluminum, and nickel.

4. The thermal management assembly of claim 1, wherein the thermal compensation base layer is formed from one or more of the following: copper, aluminum, nickel, and alloys thereof.

5. The thermal management assembly of claim 1, wherein the thermal compensation base layer comprises:
a metal inverse opal (MIO) structure;
a cap layer overgrown on the MIO structure; and
an electrically insulating layer disposed between the cap layer and the cooling jacket, the electrically insulating layer comprising a metal oxide, polymer, polyamide, or a ceramic material.

6. The thermal management assembly of claim 1, wherein the mounting surface of the cooling jacket is configured with one or more slots to accommodate the thermal compensation base layer coupled to each of the one or more devices on the printed circuit board.

7. An electronic assembly comprising:
a printed circuit board having a first surface and a second surface opposite to the first surface;
one or more switching semiconductor devices disposed on the first surface; and
a thermal management assembly comprising:
a cooling jacket mounted on a circumference of a motor and having a mounting surface tangential to the circumference of the motor, the mounting surface coupled to the first surface of the printed circuit board;
at least one jacket manifold formed through the cooling jacket, the at least one jacket manifold having a fluid inlet and a fluid outlet and defining a fluid flow area therebetween;
a thermal compensation base layer thermally coupled to the cooling jacket and the one or more switching semiconductor devices;
a cooling manifold disposed through the printed circuit board to form a fluid flow path through the printed circuit board; and
two or more electrically insulated posts disposed between the at least one jacket manifold and the cooling manifold and having a cooling channel through individual electrically insulated posts, wherein the cooling channel in at least one electrically insulated post fluidly connects the fluid inlet to the cooling manifold to form an inward fluid path and the cooling channel in at least one electrically insulated post fluidly connects the cooling manifold to the fluid outlet to form an outward fluid path.

8. The electronic assembly of claim 7 further comprising:
one or more gate drive devices disposed on the second surface and operable to control the one or more switching semiconductor devices.

9. The electronic assembly of claim 7, wherein the one or more switching semiconductor devices are formed from one or more of the following: silicon carbide (SiC), silicon dioxide ($SiO_2$), aluminum nitride (AlN), gallium nitride (GaN), and boron nitride (BN).

10. The electronic assembly of claim 7, wherein:
the printed circuit board comprises a first ceramic layer, a second ceramic layer and a third ceramic layer stacked vertically; and
each electrically insulated post extends through the first ceramic layer, the second ceramic layer and the third ceramic layer.

11. The electronic assembly of claim 7, wherein the cooling manifold comprises one or more heat transfer chambers configured to receive heat generated by the one or more switching semiconductor devices.

12. The electronic assembly of claim 7, wherein the one or more electrically insulated posts comprise poly-silicon or a ceramic material.

13. The electronic assembly of claim 7, wherein the cooling jacket is formed from one or more of the following: copper, aluminum, and nickel.

14. The electronic assembly of claim 7, wherein the thermal compensation base layer is formed from one or more of the following: copper, aluminum, nickel, and alloys thereof.

15. The electronic assembly of claim 7, wherein the thermal compensation base layer comprises:
a metal inverse opal (MIO) structure;
a cap layer overgrown on the MIO structure; and
an electrically insulating layer disposed between the cap layer and the cooling jacket, the electrically insulating layer comprising a metal oxide, polymer, polyamide, or a ceramic material.

16. The electronic assembly of claim 7 further comprising:
a capacitor centrally disposed on the printed circuit board and configured to be electrically connected to a battery.

17. The electronic assembly of claim 7, wherein:
the cooling jacket further comprises a second mounting surface; and
a capacitor is disposed on the second mounting surface, the capacitor configured to be electrically connected to a battery.

18. The electronic assembly of claim 7, wherein the one or more switching semiconductor devices are electrically coupled to the motor through phase wiring connections positioned between the printed circuit board and the motor.

19. The electronic assembly of claim 7, wherein the mounting surface of the cooling jacket comprises one or more slots to accommodate the thermal compensation base layer coupled to each of the one or more switching semiconductor devices.

20. The electronic assembly of claim 7, wherein the printed circuit board comprises Low Temperature Co-fired Ceramic (LTCC) material.

* * * * *

UNITED STATES PATENT AND TRADEMARK OFFICE
CERTIFICATE OF CORRECTION

PATENT NO. : 10,888,036 B1
APPLICATION NO. : 16/719241
DATED : January 5, 2021
INVENTOR(S) : Shailesh N. Joshi and Shohei Suenaga Page 1 of 1

It is certified that error appears in the above-identified patent and that said Letters Patent is hereby corrected as shown below:

In the Specification

In Column 3, Line(s) 25, delete "atop" and insert --a top--, therefor.

In Column 4, Line(s) 24, delete "an" and insert --a--, therefor.

In Column 6, Line(s) 46, delete "atop" and insert --a top--, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*